(12) United States Patent
Stotz et al.

(10) Patent No.: US 6,181,182 B1
(45) Date of Patent: Jan. 30, 2001

(54) CIRCUIT AND METHOD FOR A HIGH GAIN, LOW INPUT CAPACITANCE CLOCK BUFFER

(75) Inventors: Dan Stotz; Richard A. Krzyzkowski; Paul D. Nuber, all of Ft. Collins, CO (US)

(73) Assignee: Agilent Technologies, Palo Alto, CA (US)

(*) Notice: Under 35 U.S.C. 154(b), the term of this patent shall be extended for 0 days.

(21) Appl. No.: 09/272,042

(22) Filed: Mar. 18, 1999

(51) Int. Cl.[7] ...................................................... H03K 5/00
(52) U.S. Cl. ............................ 327/256; 327/291; 327/299
(58) Field of Search ..................................... 327/256, 257, 327/294, 299, 291, 293, 258, 259; 326/29, 26, 27, 82, 83, 87

(56) References Cited

U.S. PATENT DOCUMENTS

| | | | |
|---|---|---|---|
| 4,283,639 | * 8/1981 | Roesleer | 327/295 |
| 4,692,637 | * 9/1987 | Shoji | 326/94 |
| 4,950,920 | * 8/1990 | Hara et al. | 327/257 |
| 5,672,991 | * 9/1997 | Thoma et al. | 327/239 |
| 5,867,043 | * 2/1999 | Kim | 327/257 |
| 5,874,845 | * 2/1999 | Hynes | 327/259 |

FOREIGN PATENT DOCUMENTS

| | | | |
|---|---|---|---|
| 355118226 | * 9/1980 | (JP) | 327/295 |
| 401117516 | * 5/1989 | (JP) | 327/295 |

* cited by examiner

Primary Examiner—Tuan T. Lam

(57) ABSTRACT

A high gain, low input capacitance clock buffer includes a plurality of transistors configured to supply an inverted representation of an input reference signal by alternatively switching to provide the output. While either of the transistors is operating to switch the input clock signal, the other transistor is in a stable state. Furthermore, by using n-type FET's, significant power reduction and space savings may be achieved.

7 Claims, 4 Drawing Sheets

CIRCUIT AND METHOD FOR A HIGH GAIN, LOW INPUT CAPACITANCE CLOCK BUFFER

TECHNICAL FIELD

The present invention relates generally to clocking architecture, and, more particularly, to a circuit and method for a high gain, low input capacitance inverting clock buffer.

BACKGROUND OF THE INVENTION

In many integrated circuit devices, it is desirable to provide a system clock, or reference clock, signal to a number of devices within the integrated circuit package. It is also desirable to uniformly delay the reference clock signal such that the clock signal is supplied to the appropriate devices simultaneously. Typically, the clock signal is delayed by the combination of the clock buffers and a clock routing tree, or grid. A known clock buffer is illustrated in FIG. 1.

FIG. 1 is a schematic diagram of a known clock buffer 11. A clock input signal CKIN is supplied on connection 17 to one input of NAND gate 12 and one input of NOR gate 14. NAND gate 12 provides output X on connection 21 and NOR gate 14 provides output Y on connection 19. Outputs X and Y are the inverse of clock input signal on connection 17. NAND gate 12 provides input to transistor 22 and NOR gate 14 provides input to transistor 24. The output of transistors 22 and 24 in the form of a signal Z is provided over connection 26 to both inverter 27 and inverter 29. Inverter 29 supplies signal F over connection 18 to an input of NOR gate 14 and inverter 27 provides the inverse clock signal output NCK on connection 31 as feedback to NAND gate 12 via connection 16 and as input to inverter 28, the output of which is supplied as input to inverters 27 and 29.

The operation of clock buffer 11 is as follows.

Case 1 (transition)

0) Initial conditions: Z←1 F←0 NCK←0 CKIN←0
1) X←1 Y←1
2) $U_1$←off $D_1$←on
3) Z←0
4) F←1 NCK←1
5) Y←0
6) $D_1$←off; go to case 3

Case 2 (transition)

0) Initial conditions: Z←0 F←1 NCK←1 CKIN←1
1) X←0 Y←0
2) $U_1$ on $D_1$ off
3) Z←1
4) F←0 NCK←0
5) X←1
6) $U_1$←off, go to case 4

Case 3 (stable)

0) Initial conditions: Z←0 F←1 NCK←1 CKIN←0
1) X←1 Y←0
2) $U_1$←off $D_1$←off
3) upon CKIN←1, go to case 2

Case 4 (stable)

0) initial conditions: Z←1 F←0 NCK←0 CKIN←1
1) X←1 Y←0
2) $U_1$←off $DI_1$ off
3) upon CKIN←0, go to case 1

The circuit can start in the initial state of any of cases 1–4.

A drawback with the type of clock buffer described above is that it has a high input capacitance, thereby requiring many buffers, or a single large buffer, to drive the input. This condition consumes valuable space on the integrated circuit assembly.

Therefore, it would be desirable to have a clock buffer that is capable of high gain, and that has a lower input capacitance, and reduces the amount of space consumed in an integrated circuit.

SUMMARY OF THE INVENTION

The invention provides an inverting clock buffer having high gain and low input capacitance and method for generating a high drive strength clock signal in a high gain, low input capacitance clock buffer.

In architecture, the present invention may be conceptualized as an inverting clock buffer having high gain and low input capacitance, comprising: first logic configured to receive an input clock signal and supply a delayed version of the input clock signal; and a first transistor and a second transistor configured to receive the delayed input clock signal, the first transistor and the second transistor driving an output, the output being an inverse of the input clock signal.

The present invention may also be conceptualized as a method for generating a high drive strength clock signal in a high gain, low input capacitance clock buffer, the method comprising the steps of: supplying a delayed input clock input signal to a first transistor and a second transistor, the transistors configured to alternatively switch an output signal between a logic low value and a logic high value; and operating the first transistor when the second transistor is in a stable state and operating the second transistor when the first transistor is in a stable state.

The invention has numerous advantages, a few of which are delineated, hereafter, as merely examples.

An advantage of the invention is that it significantly reduces the input capacitance of a clock buffer.

Another advantage of the invention is that it significantly reduces the amount of space on an integrated circuit consumed by an inverting clock buffer.

Another advantage of the invention is that it significantly reduces the amount of average and instantaneous power consumed by an inverting clock buffer.

Another advantage of the invention is that it is simple in design and easily implemented on a mass scale for commercial production.

Other features and advantages of the invention will become apparent to one with skill in the art upon examination of the following drawings and detailed description. These additional features and advantages are intended to be included herein within the scope of the present invention.

BRIEF DESCRIPTION OF THE DRAWINGS

The present invention, as defined in the claims, can be better understood with reference to the following drawings. The components within the drawings are not necessarily to scale relative to each other, emphasis instead being placed upon clearly illustrating the principles of the present invention.

DETAILED DESCRIPTION OF THE INTENTION

The invention to be described hereafter is applicable to on-chip clocking systems, however, the invention can be employed in any system in which clocking signals are generated.

Figure 2A:
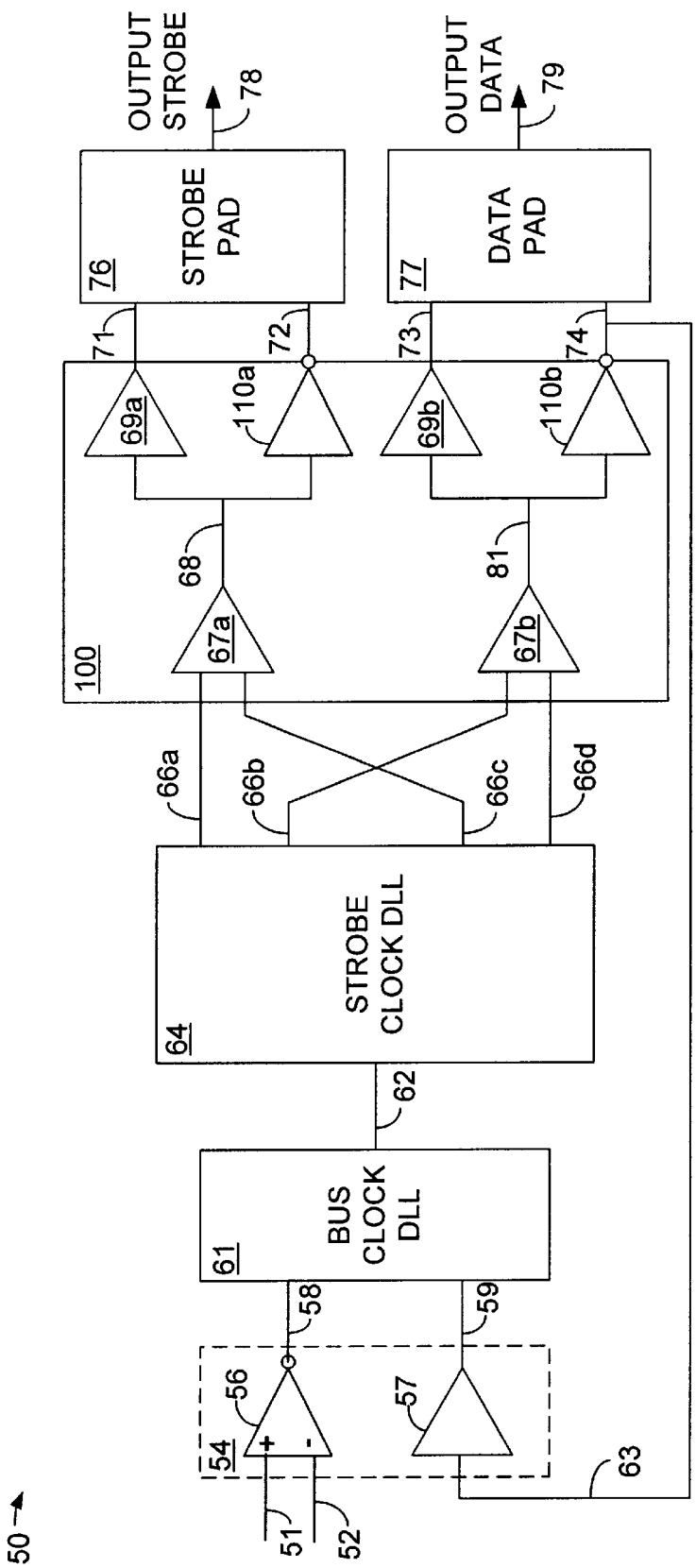
FIG. 2A is a block diagram illustrating a DLL based clocking scheme including the high gain, low input capacitance clock buffers of the present invention.

Turning now to the drawings, FIG. 2A is a block diagram illustrating a DLL based clocking scheme 50 including the high gain, low input capacitance clock buffers of the present invention. A system clock signal is supplied to clock receiver 54 over connections 51 and 52. A positive version of the system clock is supplied to inverter 56 over connection 51 and a negative version of the system clock signal is supplied to inverter 56 over connection 52. A feedback signal is supplied over connection 63 to inverter 57. Clock receiver 54 supplies over connections 58 and 59 clock signals to bus clock DLL 61. Bus clock DLL 61 supplies a reference clock signal over connection 62 to strobe clock DLL 64.

In a particular embodiment strobe clock DLL 64 includes a plurality of delay lines and inverters. Strobe clock DLL 64 supplies quadrature outputs 66a, 66b; 66c, and 66d, respectively, to main drivers 67a and 67b. Although shown as having quadrature outputs 66a–66d, strobe clock DLL 64 may provide greater or fewer outputs depending on application. Main driver 67a supplies over connection 68 the system clock signal to local buffers 69a and 110a and main driver 67b supplies the system clock signal over connection 81 to local buffers 69b and 10b. Local buffer 69a supplies a signal denoted "strobe clock 1" over connection 71 to strobe pad 76 and local buffer 110a supplies an inverted version of the signal strobe clock 1 in the form of a signal denoted "strobe clock 2" over connection 72 to strobe pad 76. Similarly, local buffer 69b supplies a system clock signal denoted "bus clock 1" over connection 73 to data pad 77 while local buffer 110b supplies an inverted version of the signal bus clock 1 denoted as "bus clock 2" over connection 74 to data pad 77.

Local buffers 110a and 110b are the inverting clock buffers of the present invention and will be described in greater detail with respect to FIG. 3. Strobe pad 76 provides an output strobe clock signal over connection 78 to other components of the system and data pad 77 provides an output data clock signal over connection 79 to other components of the system. The output strobe clock signal and the output data clock signal go to the clock inputs of synchronous storage elements on the integrated circuit assembly.

Figure 2B:
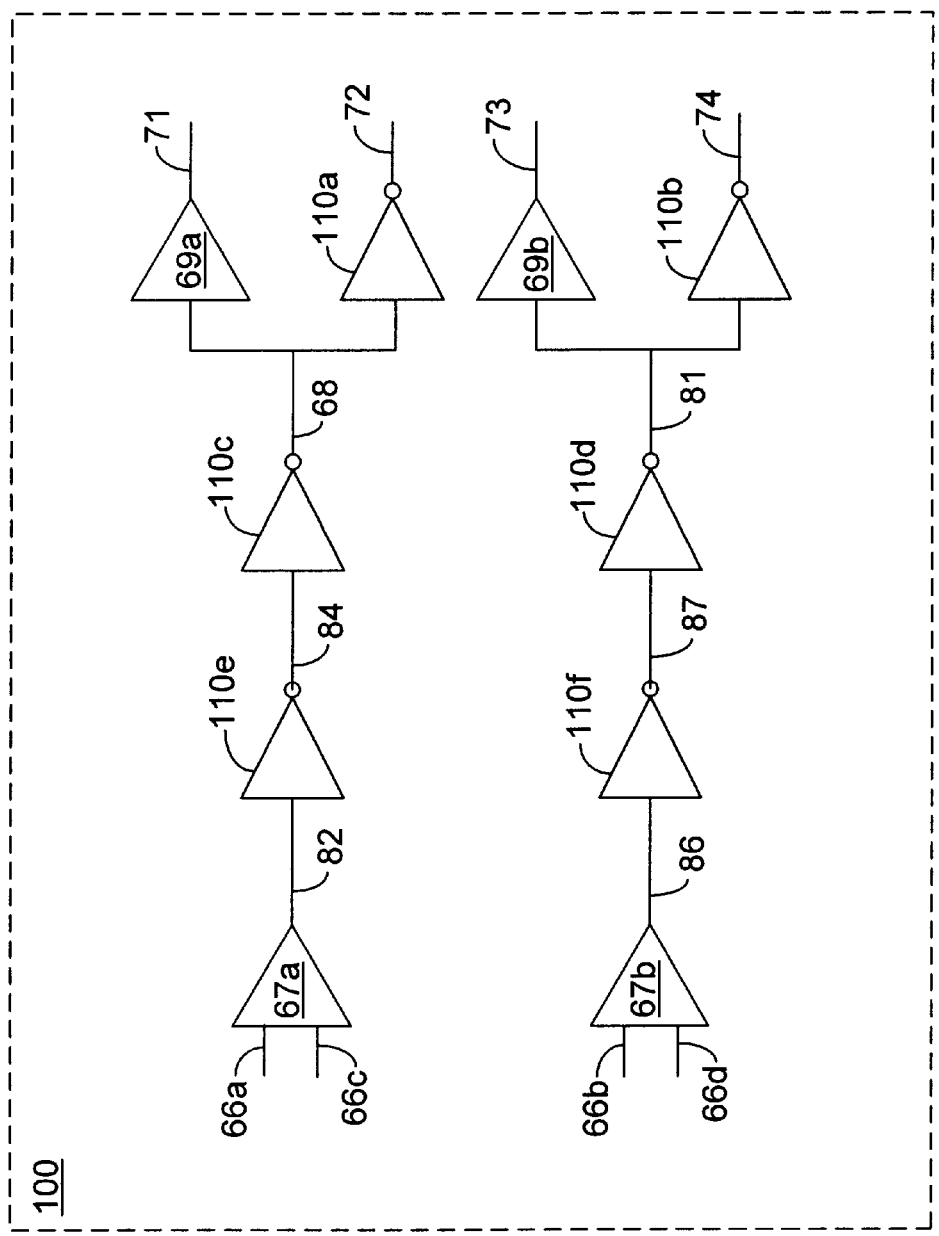
FIG. 2B is a detailed schematic view of the high gain, low input capacitance clock buffers of FIG. 2A.

FIG. 2B is a detailed schematic view including the high gain, low input capacitance clock buffers 110 of FIG. 2A. As can be seen, a plurality of high gain, low input capacitance clock buffers 110 may be employed, and indeed, the quantity of high gain, low input capacitance buffers may vary depending upon application. Specifically, high gain, low input capacitance clock buffers 110c and 110e have been added in line between main driver 67a and local buffers 69a and 110a, respectively, and high gain, low input capacitance clock buffers 110d and 110f have been added between main driver 67b and local buffer 69b and 10b. In accordance with one aspect of the invention, a plurality of high gain, low input capacitance clock buffers may be employed. However, it is also possible to employ only those high gain, low input capacitance clock buffers 110a and 110b shown in FIG. 2A.

Figure 3:
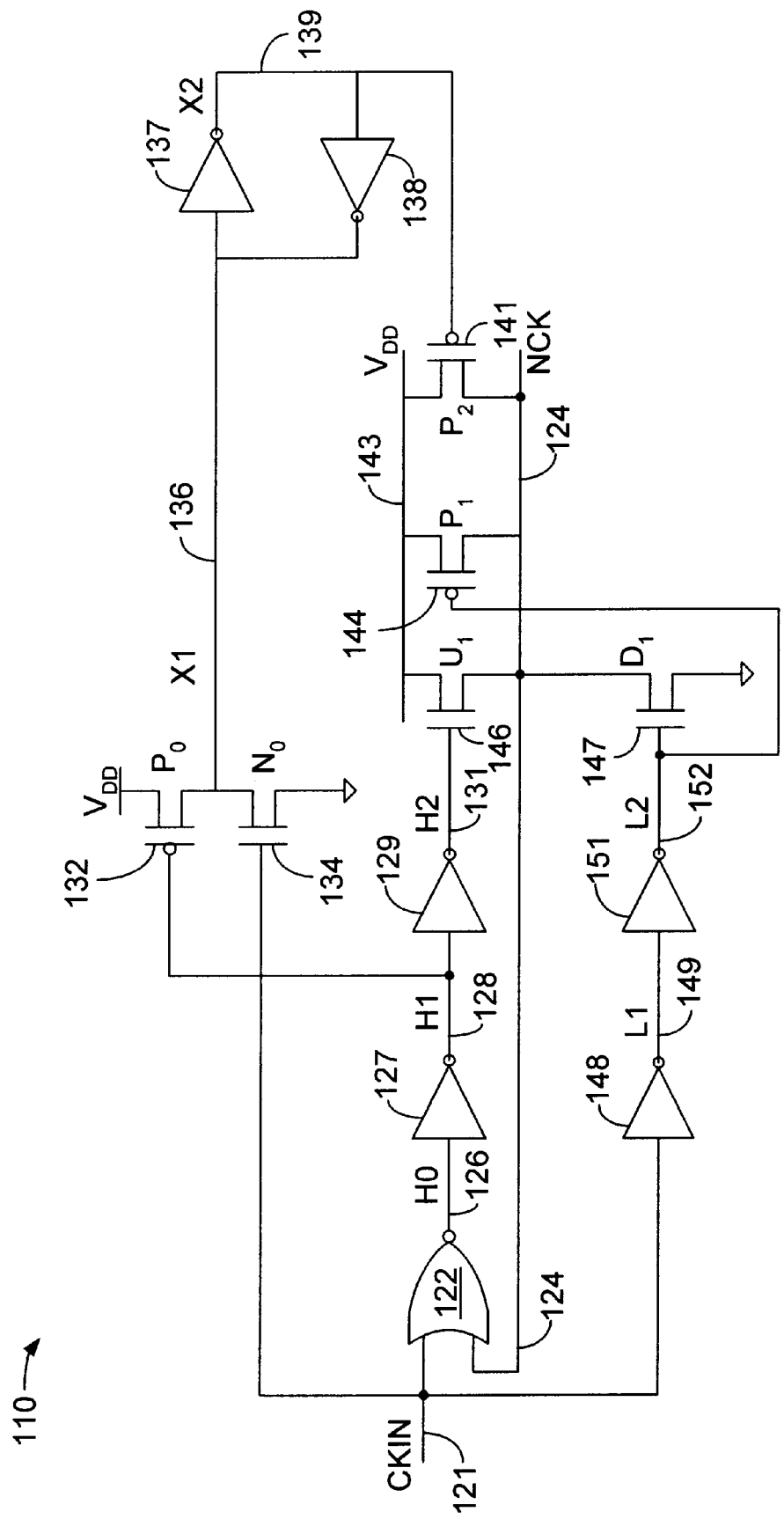
FIG. 3 is a schematic view illustrating a possible configuration of the high gain, low input capacitance clock buffer of FIG. 2A.

FIG. 3 is a schematic view illustrating a possible configuration of the high gain, low input capacitance clock buffer 110 of FIG. 2A. A clock input signal is supplied over connection 121 to one input of NOR gate 122, transistor 134, and inverter 148. The signal NCK representing an inverted version of the clock input signal CKIN is supplied over connection 124 to another input of NOR gate 122. The output H0 of NOR gate 122 on connection 126 is supplied to inverter 127. The output H1 of inverter 127 is supplied over connection 128 as input to both transistor 132 and as input to inverter 129. The output H2 of inverter 129 is supplied over connection 131 to transistor $U_1$ 146. The output L1 of inverter 148 is supplied over connection 149 to inverter 151, the output L2 of which, is supplied to transistor 147 and transistor 144 over connection 152.

The signal X1, which is derived from transistors 132 and 134, is output over connection 136 as input to inverter 137. The signal X2 is output from inverter 137 and supplied over connection 139 as input to both inverter 138 and to transistor 141 ($P_2$). The output of high gain, low input capacitance clock buffer 110 is determined through the operation of transistors $U_1$ 146 and $D_1$ 147, inthat they operate to determine the output NCK on connection 124.

Figure 1:
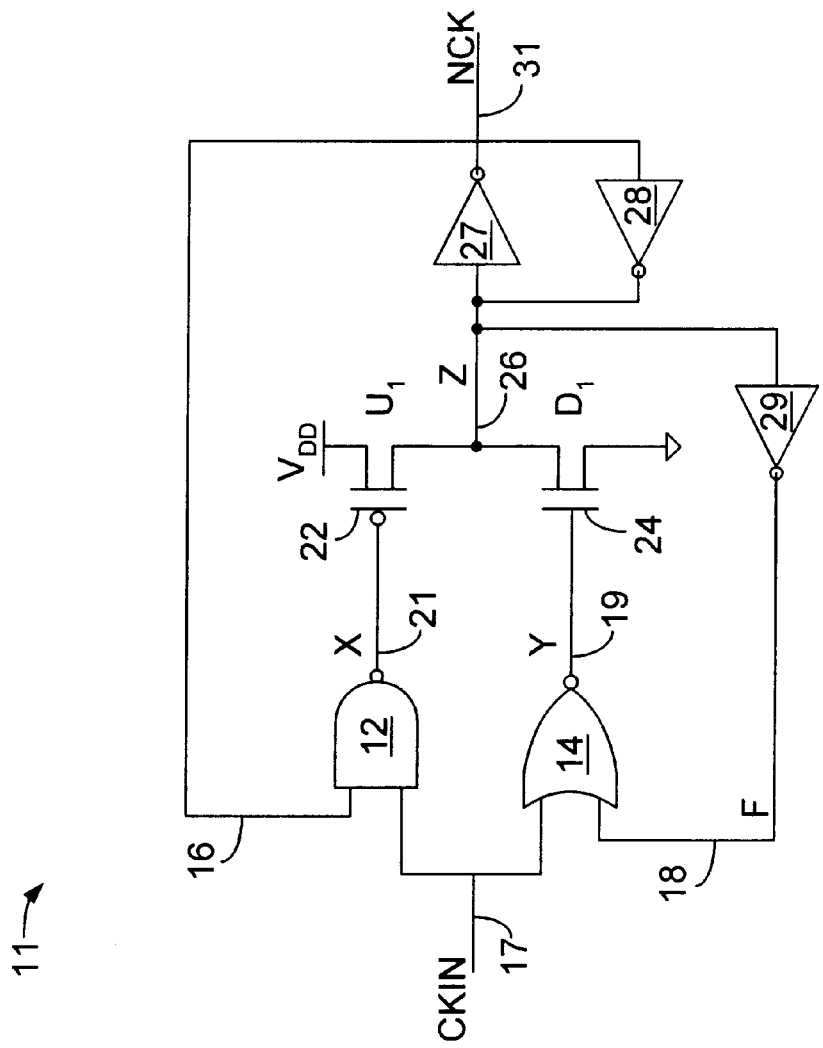
FIG. 1 is a schematic diagram of a known clock buffer.

In accordance with the invention, transistors $U_1$ and $D_1$ operate alternatively, which is to say that they do not work against each other in determining the output NCK on connection 124. This means that while $U_1$ is on or operating, transistor $D_1$ is off. In this manner, high gain, low input capacitance clock buffer 110 requires significantly less power to operate than does the clock buffer described with respect to FIG. 1. In addition, due to the configuration of the high gain, low input capacitance clock buffer 110, the same gain may be achieved for the NCK output with less area and with less input capacitance than may be achieved by clock buffers made according to FIG. 1. This translates into less load on connections 68 and 81 (FIGS. 2A and 2B), and also on connections 82, 84, 86 and 87 (FIG. 2B) if high gain, low input capacitance clock buffers 110c, 110d, 110e and 110f are used. The low input capacitance of the present invention allows improved efficiency in switching the clock input signal CKIN on connection 121 (FIG. 3) between a low and a high state.

Furthermore, it is possible to use all of the switching capability of transistors $U_1$ 146 and $D_1$ 147 to switch signal NCK to the desired value, thus allowing heretofore unrealized efficiency in switching the clock output signal NCK on connection 124 (FIG. 3) between a low and a high state.

In a preferred embodiment of the present invention, transistors $U_1$ 146, $D_1$ 147 and $N_0$ 134 are fabricated using n-type field effect transistor (n-FET) technology, while transistors $P_0$ 132, $P_1$ 144 and $P_2$ 141 are fabricated using p-type field effect transistor (p-FET) technology. Because of the n-FET design of $U_1$, significant space reduction is achieved. Transistors $P_1$ 144 and $P_2$ 141 are arranged so as to pull the NCK signal on 124 up to the voltage level $V_{DD}$ present on connection 143, because n-FET $U_1$ 146 is generally insufficient to pull signal NCK fully up to $V_{DD}$. This is so because n-FET technology has a gate threshold voltage below which it begins to turn off. This condition exists when the output of an n-FET connected in this manner approaches $V_{DD}$.

Advantageously, the circuit described in FIG. 3 allows the CKIN signal on connection 121 to drive a minimal number of transistors, thus yielding low input capacitance, while the main output transistors ($U_1$ 146 and $D_1$ 147) operate in a mutually exclusive manner, in that they do not drive fight each other. Also, the main output transistors ($U_1$ and $D_1$) are n-type FET's, resulting in an area advantage in that they consume little space. Drive fight between transistors $U_1$ 146 and $D_1$ 147 is avoided by the following two properties of the invention.

1) The pull-up transistor $U_1$ 146 turns off shortly after turning on because of negative feedback supplied through connection 124. Thus, when pull-down transistor $D_1$ 147 turns on, its performance is not degraded by a drive fight with $U_1$ 146 when switching the output NCK from a logic high to a logic low; and 2) the delay from CKIN to pull-up transistor $U_1$ 146 is slightly longer than the delay from CKIN to pull-down transistor $D_1$ 147 so $D_1$ 147 starts to turn off before $U_1$ 146 starts to turn on, thus avoiding a drive fight when switching the output NCK from a logic low to a logic high.

The pull-up transistor $P_1$ 144 helps to resolve the output to a known state upon power up, since $U_1$, 146 $D_1$, 147 and $P_2$ 141 may be initially off. Transistor $P_2$ 141 helps to pull the output NCK up to $V_{DD}$ when the circuit is switching the output NCK from a logic low to a logic high, compensating for the above-mentioned condition in which $U_1$ 146 is generally insufficient to pull the signal NCK fully up to $V_{DD}$.

The storage element (cross-coupled inverters 137 and 138) driving transistor $P_2$ 141 holds the state on the input to the pull-up transistor $P_2$, since the normal pull-up mechanism $U_1$ 146 is disabled through feedback over connection 124 shortly after the output NCK begins transition from a logic low to a logic high. Shown in the following table are the operational states of the high gain, low input capacitance clock buffer 110.

Operation:

| Case 1 | (transition) | | | | | |
|---|---|---|---|---|---|---|
| 0) | Initial | Conditions: | NCK ← 0 | CKIN ← 0 | | |
| 1) | H0 ← 1 | L1 ← 1 | $N_0$ ← off | | | |
| 2) | H1 ← 0 | L2 ← 0 | $P_0$ ← on | $D_1$ ← off | $P_1$ ← on | |
| 3) | H2 ← 1 | X1 ← 1 | | | $U_1$ ← on | |
| 4) | | X2 ← 0 | | | $P_2$ ← on | NCK ← 1 |
| 5) | H0 ← 0 | | | | | |
| 6) | H1 ← 1 | | $P_0$ ← off | | | |
| 7) | H2 ← 0 | | | | $U_1$ ← off | |
| 8) | go to case 3 | | | | | |
| Case 2 | (transition) | | | | | |
| 0) | Initial | Conditions: | NCK ← 1 | CKIN ← 1 | | |
| 1) | L1 ← 0 | X1 ← 0 | $N_0$ ← on | | | |
| 2) | L2 ← 1 | X2 ← 1 | | $D_1$ ← on | $P_1$ ← off | $P_2$ ← off |
| 3) | go to case 4 | | | | | NCK ← 0 |
| Case 3 | (stable) | | | | | |
| 0) | Initial | Conditions: | NCK ← 1 | CKIN ← 0 | | |
| 1) | H0 ← 0 | L1 ← 1 | $N_0$ ← off | | | $X_1$ = ? |
| | | | | | | $X_2$ = ? |
| 2) | H1 ← 1 | L2 ← 0 | $P_0$ ← off | $D_1$ ← off | $P_1$ ← on | $X_1$ = ? |
| | | | | | | $X_2$ = ? |
| 3) | H2 ← 0 | | | | $U_1$ ← off | $P_2$ ← ? |
| 4) | Upon | CKIN ← 1, | go to | case 2 | | |
| Case 4 | (stable) | | | | | |
| 0) | Initial | Conditions | NCK ← 0 | CKIN ← 1 | | |
| 1) | H0 ← 0 | L1 ← 0 | $N_0$ ← on | | | |
| 2) | H1 ← 1 | L2 ← 1 | $P_0$ ← off | $D_1$ ← on | $P_1$ ← off | |
| 3) | H2 ← 0 | X1 ← 0 | $P_0$ ← off | | $U_1$ ← off | |
| 4) | | X2 ← 1 | | | $P_2$ ← off | |
| 5) | Upon | CKIN ← 0, | go to | case 1 | | |

The circuit can start in the initial state of any of cases 1–4. Furthermore, transistor $P_1$ 144 prevents NCK from floating when CKIN=0 on power up, since the $P_2$ state is indeterminate in case 3.

It will be apparent to those skilled in the art that many modifications and variations may be made to the preferred embodiments of the present invention, as set forth above, without departing substantially from the principles of the present invention. For example, other configurations of the inverting clock buffer described herein may be used to achieve the high gain, low input capacitance clock buffer. All such modifications and variations are intended to be included herein within the scope of the present invention, as defined in the claims that follow.

What is claimed is:

1. An inverting clock buffer having high gain and low input capacitance, comprising:

a logic gate configured to receive a clock input signal and another signal that is an inverted and delayed representation of said clock input signal;

a first inverter configured to receive the output of said logic gate and supply an inverted output thereof;

a second inverter and a first transistor, each configured to receive as an input said clock input signal;

a third inverter and a second transistor, each configured to receive the output of said first inverter;

a fourth inverter configured to receive the output of said second inverter;

a third transistor configured to receive the output of said third inverter;

a fourth transistor configured to receive the output of said fourth inverter;

a fifth transistor configured to receive the output of said fourth inverter; and a sixth transistor configured to receive the output of a fifth inverter, said fifth inverter configured to receive a first input from said first and second transistors and also configured to supply an output to a sixth inverter, said sixth inverter configured to supply a second input to said fifth inverter, said second input also reinforcing the output of said first and second transistors, said sixth transistor configured to supply as an output said inverted representation of said clock input signal.

2. The buffer of claim 1, wherein said third transistor is operational at a time when said fourth transistor is stable and said fourth transistor operates at a time when said third transistor is stable.

3. The buffer of claim 2, wherein said third transistor and said fourth transistor are n-type field effect transistors.

4. The buffer of claim 1, wherein said inverted representation of said clock input signal is switched between a low state and a high state.

5. The buffer of claim 1, wherein said third transistor and said fourth transistor are used to switch said output of said sixth transistor.

6. The buffer of claim 1, wherein said fifth transistor and said sixth transistor are configured to raise a voltage level of said output of said sixth transistor to a predetermined level.

7. The buffer of claim 1, wherein said clock input signal provides low input capacitance.

* * * * *